United States Patent [19]

Hashimoto

[11] 4,167,027

[45] Sep. 4, 1979

[54] STABILIZING CIRCUIT FOR PHASE LOCKED LOOP

[75] Inventor: Hiroyoshi Hashimoto, Neyagawa, Japan

[73] Assignee: Sanyo Electric Co., Ltd., Osaka, Japan

[21] Appl. No.: 896,613

[22] Filed: Apr. 14, 1978

[30] Foreign Application Priority Data

Apr. 14, 1977 [JP] Japan .................................. 52/43905

[51] Int. Cl.² .......................... H04N 5/04; H04N 7/00
[52] U.S. Cl. ...................................... 360/37; 325/419; 329/122
[58] Field of Search ............................. 360/36, 37, 38; 179/100.4 ST; 358/127; 329/122; 325/419

[56] References Cited

U.S. PATENT DOCUMENTS

| 3,887,941 | 6/1975 | Dann et al. .............................. 360/37 |
| 4,126,886 | 11/1978 | Takahara et al. ........................ 360/37 |

*Primary Examiner*—Stuart N. Hecker
*Attorney, Agent, or Firm*—Armstrong, Nikaido, Marmelstein & Kubovcik

[57] ABSTRACT

A stabilizing circuit for a phase locked loop comprising an input terminal for receiving an input pulse signal, a voltage controlled oscillator, a phase comparator for comparing the phases of the input pulse signal and the output of the voltage controlled oscillator, and a low pass filter for filtering the output of the voltage controlled oscillator for providing a voltage control signal to the voltage controlled oscillator, characterized in that the stabilizing circuit comprises a random noise source for generating a random noise input to the input terminal which has a frequency sufficiently high with respect to the frequency of the normal input pulse signal, a switching circuit preliminarily applying the random noise input to the input terminal and responsive to the normal input pulse signal for selectively applying the normal input pulse signal to the input terminal, and an adjusting circuit for adjusting the input of the voltage controlled oscillator when the random noise input is received to a level close to the input level of the voltage controlled oscillator when the normal input pulse signal is received, whereby the operation of the phase locked loop is stabilized in a short time period after the normal input pulse signal is received.

14 Claims, 6 Drawing Figures

STABILIZING CIRCUIT FOR PHASE LOCKED LOOP

BACKGROUND OF THE INVENTION

1. Field of the Invention

The present invention relates to a stabilizing circuit for a phase locked loop. More specifically, the present invention relates to an improved stabilizing circuit for stabilizing a phase locked loop in a shortened time period when an input pulse signal is received.

2. Description of the Prior Art

A phase locked loop has been utilized in various types of electrical equipment. One application of a phase locked loop comprises a video disk player, wherein a phase locked loop is utilized for detecting a time base error, i.e. fluctuation of the time base of a horizontal synchronizing signal of a reproduced composite video signal for the purpose of correcting the time base error of the reproduced video signal. A scheme for correcting a time base error of a reproduced video signal responsive to fluctuation of the time base of a reproduced horizontal synchronizing signal has been fully described in United States patent application, Ser. No. 714,904, now U.S. Pat. No. 4,127,886, entitled "Jitter Correcting System in Video Reproducing Apparatus", filed Aug. 16, 1976 and assigned to the same assignee as the present invention.

A typical phase locked loop comprises an input pulse signal source for providing an input pulse signal of a given frequency, a voltage controlled signal generating means such as a voltage controlled oscillator for providing a signal of the frequency associated with a voltage control signal applied thereto, a phase comparator for comparing the phases of the input pulse signal and the output from the voltage controlled signal generating means, and a low pass filter for filtering the output of the phase comparator for providing a voltage control signal to the voltage controlled signal generating means. In one type of a phase locked loop, the output of the voltage controlled oscillator is directly applied to the phase comparator. On the other hand, in another type of a phase locked loop, the output of the voltage controlled oscillator is applied through a frequency divider to the phase comparator. In either case, the output level of the low pass filter becomes indefinite, if and when no input pulse signal is received from the input pulse signal source. In such a situation, a certain time period is required after a normal input pulse signal is received until the operation of the phase locked loop is stabilized. Such time period for stabilization of the phase locked loop is different depending on the circuit configuration of the phase locked loop. Thus, a certain type of a phase locked loop requires an undesirably prolonged time period for stabilization of the operation thereof. The above discussed problem is aggravated particularly in a case where an input pulse signal is often interrupted in the course of the operation of the equipment. For example, if a phase locked loop is employed in a video disk player for correcting a time base error of a reproduced video signal, the above discussed problem is aggravated by a provision of a pause scheme in the video disk player, which interrupts the operation of the phase locked loop and thus entails a prolonged time period for stabilization of a phase locked loop operation.

In order to describe in more detail the above discussed disadvantage, a starting operation of a typical phase locked loop will be described in the following. FIG. 1 shows a block diagram of such a typical conventional phase locked loop. FIG. 2 shows wave forms of the electrical signals at various portions in the FIG. 1 diagram. Referring to FIG. 1, the phase locked loop shown comprises a phase comparator connected to receive a normal input pulse signal through an input terminal 1 at one input thereof, a low pass filter 4 for filtering the output of the phase comparator 2 for providing a voltage control signal, and a voltage controlled oscillator 3 responsive to the voltage control signal from the low pass filter 4 for oscillating at a frequency associated with the voltage control signal, the output signal from the voltage controlled oscillator 3 being applied to another input of the phase comparator 2. The output of the voltage controlled oscillator 3 may be frequency divided by means of a frequency divider 5 interposed between the voltage controlled oscillator 3 and the phase comparator 2. With simultaneous reference to FIGS. 1 and 2, let it be assumed that a normal input pulse signal al as shown in FIG. 2 is received at the input terminal 1, starting at a time point t0. The input pulse signal al may be a horizontal synchronizing signal of a reproduced video signal obtained by a video disk player, for example. The phase comparator 2 is structured to provide a saw-tooth wave d1 responsive to the oscillation output signal from the voltage controlled oscillator 3. Therefore, starting from the time point t0, the saw-tooth wave signal is sampled by the pulse signal al, whereby an output signal of the wave form as shown as b1 in FIG. 2 is obtained from the phase comparator 2. The output signal b1 is applied to the low pass filter 4, whereby an output signal of the wave form as shown as c1 in FIG. 2 is obtained. The output of the low pass filter 4 before the normal input pulse signal is received at the time point t0 is in an indefinite level such as V0. At a time point t1 after the lapse of a given time period T since the input pulse signal comes to be received at the time point t0, an ultimately stabilized level V1 is reached. The above described time period T from the start of the normal input pulse signal to a time point where the phase locked loop operation is stabilized, i.e. the time period $T = t1 - t0$, may be referred to as a pull-in time period and is dependent on the characteristic of the low pass filter and the difference between the level V0 before the normal input pulse signal is received and the level V1 after the phase locked loop operation is stabilized. More specifically, the larger the time constant of the low pass filter, or the larger the difference between the levels V0 and V1, the longer the pull-in time period of the phase locked loop.

FIG. 3 shows wave forms of the output of the low pass filter 4 in two different situations. Referring to FIG. 3, the wave form c3 shows an example in which the pull-in time period is prolonged when the indefinite level V0 is too small as at V01 with respect to the stabilized level V1, while the wave form c3' shows an example in which the pull-in time period is shortened when the indefinite level V0 is close to the stabilized level V1 as at V02. Thus, it would well be appreciated that in order to shorten the pull-in time period the phase locked loop should be preferably structured such that the above described level difference may be eliminated when the characteristic of the low pass filter has been fixed. Nevertheless, when no input pulse signal is obtained at the input terminal 1, the voltage level of the output from the low pass filter 4 becomes indefinite. As a result, it is impossible to control the above described level difference between the indefinite level V0 and the stabilized level V1.

A prior art phase locked loop of interest to the present invention is seen in U.S. Pat. No. 3,059,187, issued Oct. 16, 1962 to R. M. JAFFE. The phase locked loop disclosed in the referenced patent comprises a phase comparator adapted to receive an input pulse signal and an output from a voltage controlled oscillator and a low pass filter for filtering the output of the phase comparator for providing a voltage control signal to the voltage controlled oscillator. The phase comparator is adapted to receive the input signal selectively from either an input pulse signal generator or a harmonic generator. More specifically, the phase comparator is adapted to be preliminarily supplied through a switching circuit with several harmonics from the harmonic generator so that a phase locked state is achieved with one of the harmonics but, whenever the input pulse signal is received, is adapted to be selectively supplied with the input pulse signal through the switching circuit which is switched responsive to the input pulse signal, while the phase locked state is maintained. Thus, the referenced patent is aimed to achieve a phase locked state in the phase locked loop even before the normal input signal is received, by providing several harmonics to the phase comparator. This, however, necessitates a harmonic generator of a complicated circuit configuration. Thus, it is desired that an improved stabilizing circuit for a phase locked loop of a simplified circuit configuration is provided. The present invention acheives that purpose.

SUMMARY OF THE INVENTION

Briefly described, the present invention comprises a stabilizing circuit for a phase locked loop, comprising: means for providing an input pulse signal, voltage controlled signal generating means responsive to a voltage control signal for providing a signal having the freuquency associated with the magnitude of the voltage control signal, phase comparator means responsive to the input pulse signal and the output signal from the voltage controlled signal generating means for comparing the phases of the input pulse signal and the output of the voltage controlled signal generating means, and low pass filter means for filtering the output of the phase comparator means for providing a voltage control signal to the voltage controlled signal generating means, characterized in that the stabilizing circuit comprises pseudo input pulsive signal generating means for providing to the phase comparator means a pseudo input pulsive signal having the freuqency sufficiently high with respect to the frequency of the input to the phase comparator means from the voltage controlled signal generating means, switching means operatively coupled to the input pulse signal providing means and the pseudo input pulsive signal providing means for preliminarily applying the pseudo input pulsive signal to the phase comparator means for bringing the input level of the voltage controlled signal generating means to a given level without the phase being locked and associated with receipt of the normal input pulse signal from the input pulse signal providing means for selectively applying the normal input pulse signal to the phase comparator means for achieving a phase locked state, and adjusting means for adjusting the input level of the voltage controlled signal generating means when the pseudo input pulsive signal is received by the phase comparator means to an input level of the voltage controlled signal generating means when the normal input pulse signal is received by the phase comparator means, whereby the phase locked loop is stabilized in a shorter time period after the normal input signal is received.

According to the present invention, the input level of the voltage controlled signal generating means before the normal input signal is received by the phase comparator means is controlled to be close as much as possible to the stabilized input level of the voltage controlled signal generating means achieved when the normal input signal is received by the phase comparator means. As a result, the operation of the phase locked loop is stabilized in a short time period when the normal input signal is received.

Accordingly, a principal object of the present invention is to provide an improved stabilizing circuit for a phase locked loop, wherein the phase locked loop is stabilized in a short time period after an input pulse signal is received.

Another object of the present invention is to provide an improved stabilizing circuit for a phase locked loop, wherein the circuit configuration of the stabilizing circuit is simplified.

An aspect of the present invention is to provide an improved phase locked loop having two operation modes, one being a stabilizing operation mode in which a pseudo input pulsive signal having the frequency sufficiently high with respect to the frequency of the normal input signal is applied to the phase comparator for bringing the input level of a voltage controlled signal generating means coupled to the phase comparator to a given input level without the phase being locked, and the other mode being a normal operation mode in which when a normal input pulse signal is received the phase comparator is switched to receive the normal input singal to achieve a phase locked state, the level difference between the input level of the voltage controlled signal generating means in the stabilizing operation mode and the input level of the voltage controlled signal generating means in the normal operation mode being adapted to be minimum.

These objects and other objects, features, aspects and advantages of the present invention will become more apparent from the following detailed description of the present invention when taken in conjunction with the accompanying drawings.

Figure 1:
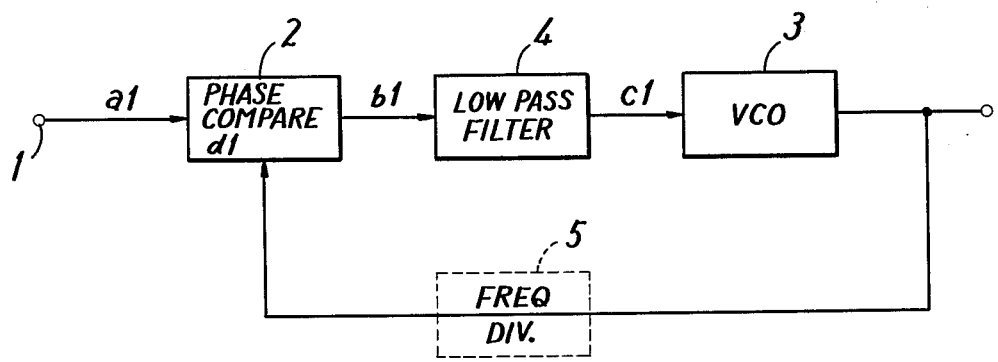
FIG. 1 shows a block diagram of a typical conventional phase locked loop.
Figure 2:
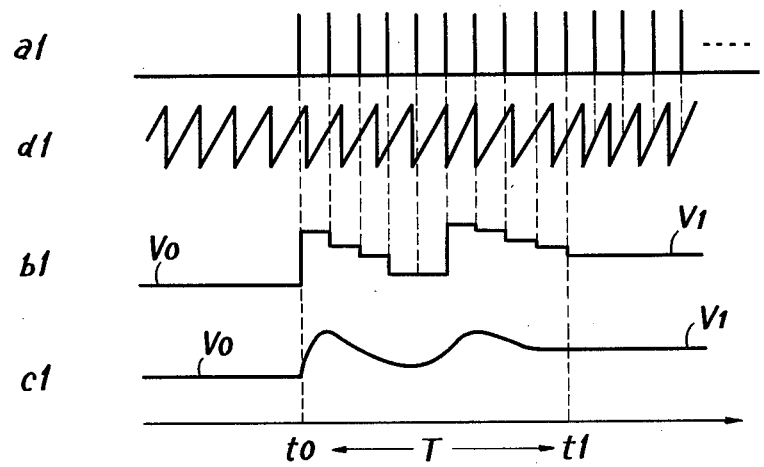
FIG. 2 shows wave forms of the electrical signals at various portions in the FIG. 1 diagram.
Figure 3:
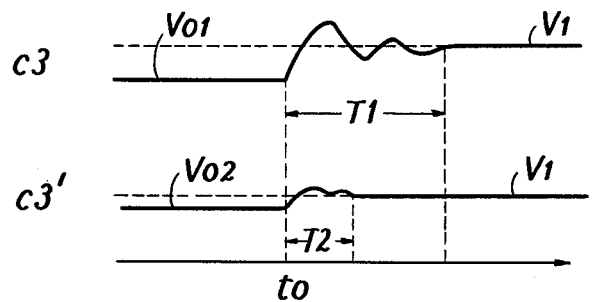
FIG. 3 shows wave forms of the input signal to the voltage controlled oscillating means in the FIG. 1 diagram in two different situations.
Figure 4:
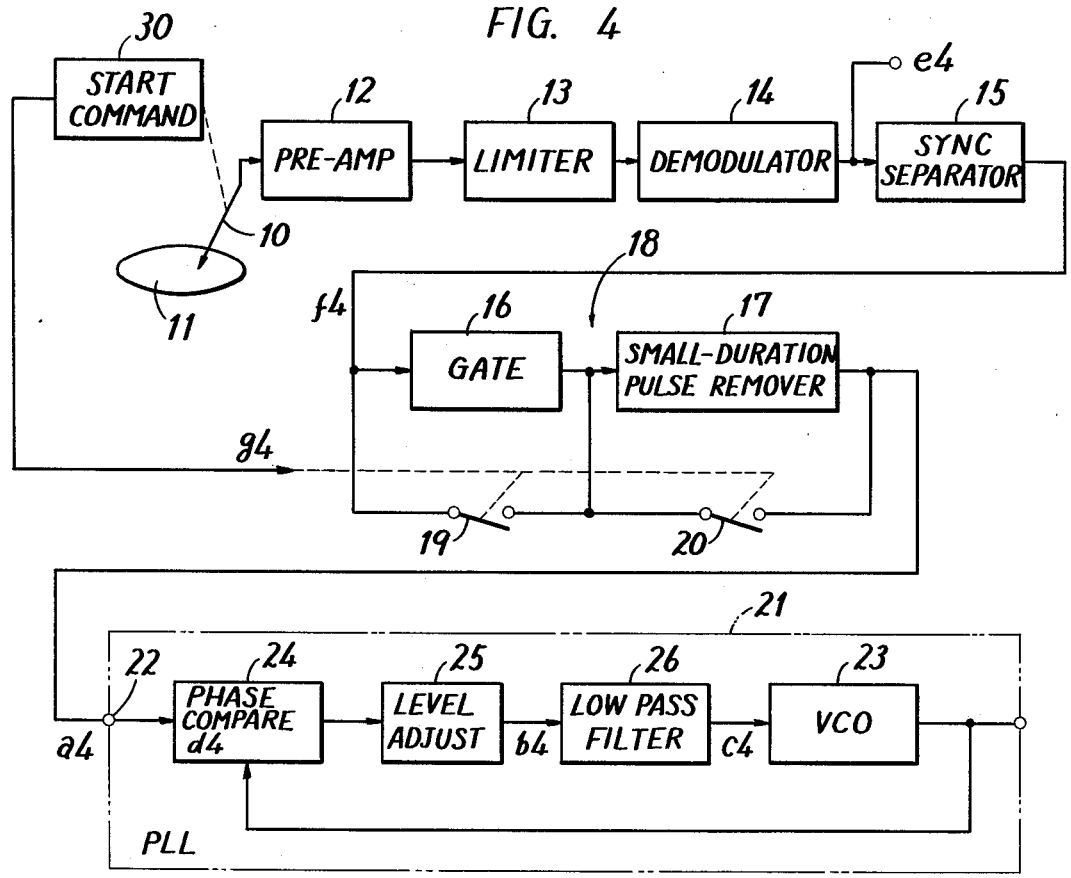
FIG. 4 shows a block diagram of a video disk player employing the inventive stabilizing circuit for a phase locked loop.

DESCRIPTION OF THE PREFERRED EMBODIMENTS:

FIG. 4 shows a block diagram of one embodiment of a video disk player employing the inventive stabilizing circuit for a phase locked loop. A pickup 10 is structured to reproduce an electrical signal recorded on a video disk 11. The reproduced electrical signal comprises a composite video signal. The reproduced electrical signal is applied to a preamplifier 12, where the signal is amplified. The output from the preamplifier 12 is applied to a limiter 13 for the purpose of amplitude limiting. The output signal from the limiter 13 is applied to a demodulator 14, where a video signal E4 is demodulated. The demodualted video signal is also applied to a synchronizing signal separator circuit 15, where a horizontal synchronizing signal f4 is obtained.

The horizontal synchronizing signal f4 is applied to a signal processing circuit 18 which comprises a gate circuit 16 and a small-duration pulse removing circuit 17, and switches 19 and 20 for shunting the gate circuit 16 and the small-duration pulse removing circuit 17, respectively, adapted to be operable as a function of a gate control signal g4. The gate control signal g4 is obtained from a start command circuit 30, which is operatively coupled to the pickup 10, such that whenever the pickup 10 is brought to an operating position the gate control signal g4 is obtained from the start command circuit 30. The output of the small-duration pulse removing circuit is applied to a phase locked loop 21 which comprises a phase comparator 24, a level adjusting circuit 25, a low pass filter 26, and a voltage controlled oscillator 23.

The horizontal synchronizing signal f4 is applied to the gate circuit 16, which comprises a fly wheel circuit responsive to the horizontal synchronizing signal for generating a gate signal in the vicinity of the horizontal synchronizing signal and a switching circuit responsive to the gate signal for sampling only the horizontal synchronizing signal portion. The output of the gate circuit 16 is applied to the small-duration pulse removing circuit 17, which may be a low pass filter.

Figure 5:
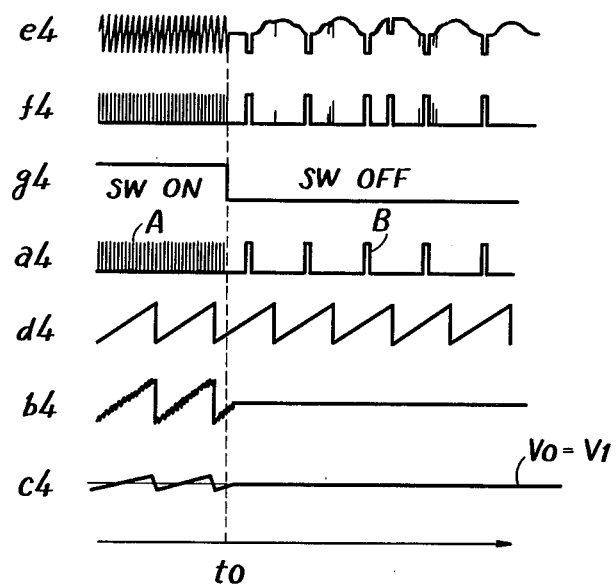
FIG. 5 shows wave forms of the electrical signals at various portions in the FIG. 4 diagram.

The operation of the FIG. 4 embodiment is better understood with reference to FIG. 5, which shows wave forms of the electrical signals at various portions in the FIG. 4 embodiment. As seen from the FIG. 5 illustration, the time period before the time point t0 is a stabilizing operation mode, while the time period after the time point t0 is a normal operation mode. According to the essential feature of the present invention, in the stabilizing operation mode, a random noise such as a white noise of 4 through 5 MHz is applied to the phase comparator 24, as to be more fully described. Since in the time period before the time point t0 the video disk player is not in a reproducing operation, the said time period is utilized for the purpose of stabilizaton of the phase locked loop by the use of a random noise, according to the present invention. As well known to those skilled in the art, it could happen that a reproduced video signal comprises undesired pulses occurring based on a so called drop out, which are shown as irregular pulsive signals in the wave forms e4 and f4 in FIG. 5. When a horizontal synchronizing signal including such undesired pulses is utilized for detection of jitter, a malfunction could result. In order to such a malfunction, therefore, the horizontal synchronizing signal is applied to the gate circuit 16 and the small-duration pulse removing circuit 17 to remove the above described undesired pulses. When the signal passes the gate circuit 16 and the small-duration pulse removing circuit 17, the above described undesired pulses are removed and only a train of the horizontal synchronizing signal is obtained. At the same time, however, the gate circuit 16 and the small-duration pulse removing circuit 17 serve to remove the above described random noise component. Therefore, in order to provide a random noise to the phase comparator 24, before the time point t0 is reached, i.e. before the pickup 10 is brought to an operating position and a train of the horizontal synchronizing signal is obtained, the switches 19 and 20 are adapted to be turned on responsive to the switch control signal g4 from the start command circuit 30, thereby to shunt the gate circuit 16 and the small-duration pulse removing circuit 17, respectively, and to bypass the output of the synchronizing signal separator circuit 15 to the phase comparator 24. Since the output of the synchronizing signal separator circuit 15 comprises a random noise, such a random noise is applied to the phase comparator 24, before the time point t0 is reached, i.e. before the pickup 10 is brought to an operating point and the horizontal synchronizing signal is obtained.

As a result of switching operation of the switches 19 and 20, it follows that the input terminal 22 of the phase locked loop 21 receives the random noise A before the time point t0 is reached and after the time point t0 receives only a train of the horizontal synchronizing signal B. According to the embodiment shown, the frequency of the input signal to the phase comparator 24 before the time point t0 is reached is about 4 through 5 MHz as is typical for a random noise, whereas the frequency of the normal horizontal synchronizing signal is the so called line frequency. The phase comparator 24, the low pass filter 26 and the voltage controlled oscillator 23 constitute a phase locked loop 21. Therefore, before the above described time point t0 is reached, the phase locked loop operates such that the phase comparator 24 samples a saw-tooth wave d4 deemed as an output of the voltage controlled oscillator 23 as a function of a random noise signal having a sufficiently high frequency as compared with the frequency of the saw-tooth wave d4, thereby to provide a comparison output b4 which is similar to the saw-tooth wave d4. Since the above described comparison output is filtered by means of the low pass filter 26, an output corresponding to a direct current component level of the input to the voltage controlled oscillator shown as at c4 is obtained from the low pass filter 26.

If and when the signal being sampled d4 is a sine wave, in order that the wave form of the signal being sampled d4 of the phase comparator 24 may be similar to the wave form of the output b4 of the phase comparator 24, the frequency of the input sampling pulse a4 must be higher than two times the frequency of the signal being sampled d4. If and when the signal being sampled d4 is a non-sine wave form, such as a saw-tooth wave, then the frequency of the input sampling pulse a4 must be higher than two times the harmonic component frequency of the signal being sampled d4. The above described random noise meets the above described requirements.

The direct current component level output is applied to the adjusting circuit 25, where adjustment is made such that two input level of the voltage controlled oscillator 23 closed as much as possible to the stabilized level V1 which is attained when the normal input signal i.e. a train of the horizontal synchronizing signal is received by the phase comparator 24.

Figure 6:
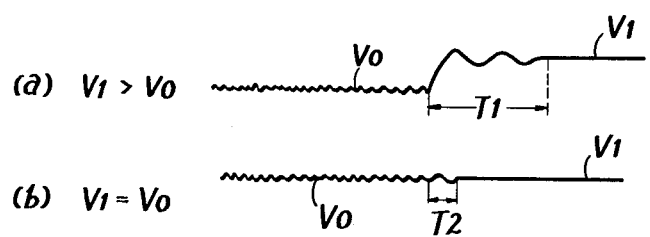
FIG. 6 shows wave forms of the input signal to the voltage controlled oscillating means in the FIG. 4 diagram in two different situations.

FIG. 6 shows the level difference of the input level of the voltage controlled oscillator 23 in different situations, in which (a) shows the situation where the level in the stabilizing operation mode V0 and the level in the normal operation mode V1 differ largely from each other, while (b) shows the situation where the level V0 in the stabilizing operation mode is adjusted to be close to the level V1 in the normal operation mode. Thus, according to the present invention, even before the time point t0 is reached, the input level of the voltage controlled oscillator can be adjusted to be close to the stabilization level attained in the normal operation mode and as a result the operation of the phase locked loop is stabilized in a shortened time period when the normal input pulse signal is received.

Although in the foregoing the present invention was described as practiced in a video disk player as a phase locked loop for detecting a time base error of a horizontal synchronizing signal of a reproduced composite video signal for correcting the time base error of the horizontal synchronizing signal, it should be pointed out that the present invention can be applied to any type of a phase locked loop utilized in any applications. In the foregoing, the present invention was described as utilizing a random noise obtainable from the horizontal synchronizing signal separator circuit as a pseudo input pulsive signal for preliminarily bringing the input level of the voltage controlled oscillator to a given level before a normal input pulse signal is received. However, the same should not be construed by way of limitation, inasmuch as any signal source for providing a pulsive signal having the frequency sufficiently high with respect to the frequency of the input to the phase comparator from the voltage controlled oscillator, such as a subcarrier oscillator in a video disk player, can be utilized as a pseudo input pulsive signal source. The level adjusting circuit may also be provided anywhere for the purpose of adjusting the average level of the input to the voltage controlled oscillator, without being limited to the embodiment shown. It is further pointed out that a voltage controlled oscillator constituting a phase locked loop should neither be construed by way of limitation, inasmuch as the present invention can be applied to a phase locked loop including any type of a voltage controlled signal generating means responsive to a voltage control signal for generating a signal having the frequency associated with the control voltage, such as a motor adapted to be driven at a rotation speed associated with a source voltage therefor and adapted for generating a pulse signal of the frequency associated with the rotation speed. It is intended that the present invention also covers such a modification.

Although the present invention has been described and illustrated in detail, it is clearly understood that the same is by way of limitation and example only and is not to be taken by way of limitation, the spirit and scope of the present invention being limited only by the terms of the appended claims.

What is claimed is:

1. A stabilizing circuit for a phase locked loop, comprising:
    means for providing an input pulse signal,
    voltage controlled signal generating means responsive to a voltage control signal for providing a signal having a frequency associated with the magnitude of the voltage control signal,
    phase comparator means responsive to the input pulse signal and the output signal from said voltage controlled signal generating means for comparing the phase of the input pulse signal with the phase of output signal of said voltage controlled signal generating means, and
    low pass filter means for filtering the output signal of said phase comparator means for providing a voltage control signal to said voltage controlled signal generating means, said stabilizing circuit comprising
    pseudo input pulse signal generating means for providing to said phase comparator means with a psuedo input pulse signal having a frequency sufficiently high with respect to the frequency of the input to said phase comparator means from said voltage controlled signal generating means,
    switching means operatively coupled to said input pulse signal providing means and said pseudo input pulse signal generating means for preliminarily applying said pseudo input pulse signal to said phase comparator means for bringing the input level of said voltage controlled signal generating means to a given level without the phase being locked by said phase locked loop and associated with receipt of the input pulse signal from said input pulse signal providing means for selectively applying said input pulse signal to said phase comparator means for achieving a phase locked state by said phase locked loop, and
    adjusting means operatively coupled to said low pass filter means for adjusting the input level of said voltage controlled signal generating means when the pseudo input pulse signal is received by said phase comparator means to an input level attained by said voltage controlled signal generating means when the input pulse signal is received by said phase comparator means, whereby said phase locked loop is stabilized in a shorter time period after the input pulse signal is received.

2. A stabilizing circuit for a phase locked loop in accordance with claim 1, wherein the frequency of said pseudo input pulse signal is selected to be higher than twice the frequency of the output signal from said voltage controlled signal generating means.

3. A stabilizing circuit for a phase locked loop in accordance with claim 2, wherein said pseudo input pulse signal generating means comprises means for providing random noise.

4. A stabilizing circuit for a phase locked loop in accordance with claim 2, wherein said pseudo pulsive signal generating means comprises an oscillator.

5. A stabilizing circuit for a phase locked loop in accordance with claim 2, wherein said phase locked loop is provided in a video reproducing apparatus comprising means responsive to a recording medium for generating a composite video signal, means responsive to said composite video signal for providing a horizontal synchronizing signal, and means associated with said video reproducing apparatus for providing a switch control signal associated with said provision of said horizontal synchronizing singal, said input pulse signal providing means comprising said means responsive to said composite video signal for providing a horizontal synchronizing signal, and said switching means being adapted to be responsive to said switch control signal.

6. A stabilizing circuit for a phase locked loop in accordance with claim 5, wherein said horizontal synchronizing signal providing means comprises means responsive to said composite video signal for separating a horizontal synchronizing signal, and gate means responsive to said horizontal synchronizing signal for gating the vicinity of said horizontal synchronizing signal.

7. A stabilizing circuit for a phase locked loop in accordance with claim 6, wherein said random noise providing means comprises said horizontal synchronizing signal separator means, and said switching means comprises means for short circuiting said gate means for bypassing a random noise component from said horizontal synchronizing signal separator means to said phase comparator means.

8. A stabilizing circuit for a phase locked loop adapted for a horizontal synchronizing signal of a reproduced video signal in a video reproducing apparatus, said video reproducing apparatus comprising means responsive to a recording medium for generating a composite video signal, means responsive to said composite video signal for providing a horizontal synchronizing signal, and means associated with said video reproducing apparatus for providing a switch control signal associated with provision of said horizontal synchronizing signal, said phase locked loop comprising voltage controlled oscillating means responsive to a voltage control signal for providing a signal having the frequency associated with the magnitude of the voltage control signal, phase comparator means responsive to said horizontal synchronizing signal and the output signal from said voltage controlled oscillating means for comparing the phase of said horizontal synchronizing signal with the phase of the output signal of said voltage controlled oscillating means, and low pass filter means for filtering the output signal of said phase comparator means for providing a voltage control signal to said voltage controlled oscillating means, said stabilizing circuit comprising pseudo input pulse signal generating means for providing to said phase comparator means a pseudo input pulse signal having a frequency sufficiently high with respect to a frequency of the input to said phase comparator means from said voltage controlled oscillating means, switching means operatively coupled to said switch control signal for preliminarily applying said pseudo input pulse signal to said phase comparator means for bringing the input level of said voltage controlled oscillating means to a given level without the phase being locked by said phase locked loop before said horizontal synchronizing signal is received and for selectively applying said horizontal synchronizing signal to said phase comparator means for achieving a phase locked state by said phase locked loop after said horizontal synchronizing signal is received, and adjusting means operatively coupled to said low pass filter means for adjusting the input level of said voltage controlled oscillating means when said pseudo input pulse signal is received by said phase comparator means to an input level of said voltage controlled oscillating means when said horizontal synchronizing signal is received by said phase comparator means, whereby the phase locked loop is stabilized in a shorter time period after said horizontal synchronizing signal is received.

9. A stabilizing circuit for a phase locked loop in a video reproducing apparatus in accordance with claim 8, wherein the frequency of said pseudo input pulse signal is selected to be higher than twice the frequency of the output signal from said voltage controlled oscillating means.

10. A stabilizing circuit for a phase locked loop in a video reproducing apparatus in accordance with claim 9, wherein said pseudo input pulse signal generating means comprises an oscillator provided in said video reproducing apparatus.

11. A stabilizing circuit for a phase locked loop in a video reproducing apparatus in accordance with claim 9, wherein said pseudo input pulse signal generating means comprises means for providing random noise.

12. A stabilizing circuit for a phase locked loop in a video reproducing apparatus in accordance with claim 11, wherein said means for providing random noise comprises said means for providing a horizontal synchronizing singal.

13. A stabilizing circuit for a phase locked loop in a video reproducing apparatus in accordance with claim 11, wherein said horizontal synchronizing signal providing means comprises means responsive to said composite video signal for separating a horizontal synchronizing signal, and means coupled to said horizontal synchronizing signal separator means for gating said horizontal synchronizing signal at the vicinity of the horizontal synchronizing signal.

14. A stabilizing circuit for a phase locked loop in a video reproducing apparatus in accordance with claim 13, wherein said means for providing random noise comprises said means for separating said horizontal synchronizing signal, and said switching means comprises means responsive to said switch control signal for short circuiting said gate means for bypassing a random noise component to said phase comparator means.

* * * * *